（12） United States Patent
Meng et al.

(10) Patent No.: US 8,857,234 B2
(45) Date of Patent: Oct. 14, 2014

(54) CONTINUOUS MICROSCALE FORMING OF METAL-BASED MICROCHANNELS AND OTHER MICROCHANNEL DEVICES

(75) Inventors: Wen Jin Meng, Baton Rouge, LA (US); Fanghua Mei, Baton Rouge, LA (US)

(73) Assignee: Board of Supervisors of Louisiana State University and Agricultural and Mechanical College, Baton Rouge, LA (US)

( * ) Notice: Subject to any disclaimer, the term of this patent is extended or adjusted under 35 U.S.C. 154(b) by 783 days.

(21) Appl. No.: 13/006,951

(22) Filed: Jan. 14, 2011

(65) Prior Publication Data

US 2011/0174040 A1    Jul. 21, 2011

Related U.S. Application Data

(60) Provisional application No. 61/296,204, filed on Jan. 19, 2010.

(51) Int. Cl.
*B44B 5/00* (2006.01)
*B81C 1/00* (2006.01)

(52) U.S. Cl.
CPC ....... *B81C 1/00071* (2013.01); *B81C 2201/034* (2013.01)
USPC .............................. 72/197; 72/199; 72/366.2

(58) Field of Classification Search
CPC ........ B21B 27/02; B21B 27/021; B44B 5/00; B44B 5/009; B44B 5/0047
USPC ........ 72/196, 197, 198, 199, 226, 234, 366.2, 72/379.2; 101/22, 23
See application file for complete search history.

(56) References Cited

U.S. PATENT DOCUMENTS

| | | | | |
|---|---|---|---|---|
| 3,988,914 | A * | 11/1976 | Metcalfe et al. | 72/69 |
| 6,216,343 | B1 | 4/2001 | Leland et al. | 29/890.032 |
| 6,277,007 | B1 * | 8/2001 | Ghosh et al. | 451/194 |
| 6,925,711 | B2 * | 8/2005 | Kilmer et al. | 29/890.053 |
| 7,114,361 | B2 * | 10/2006 | Meng | 72/352 |
| 7,169,251 | B2 | 1/2007 | Guo et al. | 156/292 |
| 7,571,542 | B2 * | 8/2009 | Nishino et al. | 29/895.3 |
| 2002/0104358 | A1 * | 8/2002 | Hart | 72/251 |
| 2002/0148269 | A1 * | 10/2002 | Ruck et al. | 72/197 |

FOREIGN PATENT DOCUMENTS

WO  WO/2009/126339  10/2009

OTHER PUBLICATIONS

Cao, D.M. et al., "Fabrication of high-aspect-ratio microscale Ta mold inserts with micro-electrical-discharge-machining," Microsystem Technologies, vol. 13, pp. 503-510 (2007).
Cao, D.M. et al., Microscale compression molding of Al with surface engineered LiGA inserts, Microsyst. Technol., vol. 10, pp. 662 (2004).

(Continued)

*Primary Examiner* — Edward Tolan
(74) *Attorney, Agent, or Firm* — John H. Runnels

(57) ABSTRACT

A process is disclosed for producing metal-based, high-aspect-ratio microscale structures (HARMs), for example microchannels in a heat exchanger. The preferred manufacturing method operates in a continuous mode, and employs low-temperature rolling of metals. A process is disclosed for bonding metal microchannel sheets or plates to flat metal sheets or plates to form single-, double-, and multiple-layered microchannel structures. The process can operate at much lower temperatures than prior methods of compression microscale molding of metals, at room temperature or even lower.

19 Claims, 12 Drawing Sheets

(56) References Cited

OTHER PUBLICATIONS

Chen, K. et al., "Fram Micro- to nano-scale molding of metals: Size effect during mo0lding of single crystal A1 with rectangular strip punches," Oct. 2010.

Fleck, N.A. et al., "Strain gradient plasticity: Theory and experiment," Acta Metallurgica et Materialia, vol. 42, No. 2, pp. 475-487 (1994).

http://www.essortment.com/hobbies/howandwhentosaid.htm (accessed Jan. 19, 2010; and again Nov. 19, 2010).

http://www.makersgallery.com/goss/rollprint.html (accessed Jan. 19, 2010; and again Nov. 19, 2010).

Jiang, J. et al., "Fabrication of metal-based high-aspect-ratio microscale structures by compression molding," J. Vac. Sci. Technol., vol. A26, No. 4, pp. 745 (2008).

Jiang, J. et al., "Microscale molding replication of Cu- and Ni- based structures," Microsyst. Technol., vol. 14, pp. 1731-1737 (2008).

Mei, Fanghua et al., "Fabrication, assembly, and testing of Cu- and Al- based microchannel heat exchangers," JMEMS, vol. 17, No. 4, pp. 869-881 (2008).

\* cited by examiner

CONTINUOUS MICROSCALE FORMING OF METAL-BASED MICROCHANNELS AND OTHER MICROCHANNEL DEVICES

The benefit of the Jan. 19, 2010 filing date of provisional patent application Ser. No. 61/296,204 is claimed under 35 U.S.C. §119(e).

This invention was made with government support under grant CMMI-0556100 awarded by the National Science Foundation. The government has certain rights in this invention.

TECHNICAL FIELD

This invention pertains to the forming of metal-based, high-aspect-ratio microstructures (HARMs), for example metal-based microchannel structures and microchannel devices.

BACKGROUND ART

Metallic high-aspect-ratio microscale structures are useful in a variety of microdevices. The LiGA (Lithographie, Galvanoformung, Abformung) technique, based on deep lithography and electrodeposition, is the principal method that has been used for making metallic HARMs. In the traditional LiGA approach, a microscale pattern is generated in a polymeric resist by X-ray or UV lithography. Chemical dissolution of the patterned resist is followed by electrodeposition of metal into the developed resist recesses. Dissolution of the remaining resist after electrodeposition gives the primary metallic HARMs. The high cost of deep lithography and the slow speed of metal electrodeposition have made primary metallic HARMs too expensive for many commercial uses. Secondary, non-metallic HARMs can be replicated from a primary HARMs insert, however, by molding. Since the inception of LiGA in the early 1980's, polymer-based HARMs have been replicated from primary metallic HARMs inserts by compression or injection molding.

Alternative techniques for fabricating metallic HARMs have been explored, including serial subtractive techniques such as micromilling (µMIL), micro electrical-discharge-machining (µEDM), and LiGA-derived techniques such as micro powder injection-molding (µPIM) and micro casting (µCAS). Serial cutting techniques such as µMIL and µEDM are slow, and may suffer tool wear and breakage in cases where the cutting tool contacts the workpiece (µMIL). The µCAS technique is a "lost mold" process, in which a microscale, shaped enclosure is destroyed during casting or extraction of a part, and that therefore tends to be expensive. The µPIM technique involves multiple heat treatment steps, and is imprecise in controlling dimensions. By contrast, replication of metallic HARMs by compression molding can be used to produce multiple secondary microparts from one primary microscale mold insert; this technique can lower costs and increase throughput. Combining surface engineering and bulk material improvement of microscale mold inserts, replication of metallic HARMs by direct microscale compression molding has been demonstrated in Al, Cu, Ni, and NiTi. See D. M. Cao, W. J. Meng, Microscale compression molding of Al with surface engineered LiGA inserts, Microsyst. Technol. 10, 662 (2004); D. M. Cao, J. Jiang, W. J. Meng, J. C. Jiang, W. Wang, Fabrication of high-aspect-ratio microscale Ta mold inserts with micro-electrical-discharge-machining, Microsystem Technologies 13, 503-510 (2007); J. Jiang, Fanghua Mei, W. J. Meng, E. Lara-Curzio, Microscale molding replication of Cu- and Ni-based structures, Microsyst. Technol. 14, 1731-1737 (2008); J. Jiang, Fanghua Mei, W. J. Meng, Fabrication of metal-based high-aspect-ratio microscale structures by compression molding, J. Vac. Sci. Technol. A26(4), 745 (2008); U.S. Pat. No. 7,114,361; and published international patent application WO 2009/126339.

Microscale compression molding has been used to fabricate microchannels in high thermal conductivity metal plates such as aluminum and cooper. Flux-less bonding techniques have been used to create all-aluminum and all-copper, entirely enclosed, microchannel devices. By flowing fluids, e.g. water, through such microchannels, high heat transfer occurs between the fluid and the enclosing metal, resulting in highly efficient, metal-based microchannel heat exchangers (MHEs). These metallic MHEs combine high bulk thermal conductivity with high mechanical robustness, and are of interest to a wide array of applications in which removal of high heat flux is desired. See Fanghua Mei, P. R. Parida, J. Jiang, W. J. Meng, S. V. Ekkad, Fabrication, assembly, and testing of Cu- and Al-based microchannel heat exchangers, JMEMS 17(4), 869-881 (2008); and published international patent application WO 2009/126339.

There is an unfilled need for improved techniques for microscale compression molding of metals as a mass production technique for making metallic HARMs. First, the total molding force required for generating a structured metal piece with a given footprint scales linearly with the area of the footprint. This means that the force capacity of the compression machine increases quadratically with the characteristic linear dimension of the HARMs piece, and that large compression machines and large forces are needed to produce metallic HARMs with relatively large footprints, factors that may present difficulties in production. Also, as the area increases, there is a greater possibility that the pressure applied at different points will become nonuniform. Second, the total footprint of the molded piece should agree exactly with the footprint of the active area on the mold insert. This requirement means that retooling is needed every time a new piece is made having a new footprint: a new and different mold insert must be made, factors leading to inflexibility in HARMs production. Third, the existing processes for making metallic HARMs through microscale compression have been batch processes, which generally have lower throughputs than comparable continuous processes—were an alternative, continuous process available.

Roller printing has previously been used to impress patterns in metal on the macroscale, with features on the order of several millimeters to meters. See e.g., http://www.essortment.com/hobbies/howandwhento_said.htm (accessed Jan. 19, 2010; and again Nov. 19, 2010) and http://www.makersgallery.com/goss/rollprint.html (accessed Jan. 19, 2010; and again Nov. 19, 2010). Rolling has been used to form shaped metal pieces in a continuous fashion, including I-beams, rails, etc. See M. P. Groover, Fundamentals of Modern Manufacturing: Materials, Processes, and Systems, Wiley, Hoboken, N.J. (2007).

One geometry to form channels with patterned protrusions is illustrated schematically in FIGS. 1A and 1B. However, it would not have been considered straightforward to extend these techniques to form features with dimensions below 1 mm, particularly below 200 µm, 100 µm, 50 µm, 10 µm, 5 µm, 3 µm, 2 µm, 1 µm, or even smaller. This is because the mechanical responses of metals and alloys at these small dimensions differ from those at length scales of 1 mm and above. These nonlinear properties are such that one would not have expected rolling to be successful in forming features at these microscales. In particular, it would have been expected that the metals would be too hard for successful molding compression at these small scales.

By contrast, rolling techniques have been used to form microfluidic channels in polymer-based materials. See, e.g., U.S. Pat. No. 7,169,251. As a rule, polymers and metals deform by different mechanisms; techniques that work for the former would not, in general, be expected to work well for the latter.

Indeed, U.S. Pat. No. 6,216,343 documents the formation of microscale corrugated fins by the rather different method of successive folding, stating that the "known groove forming methods of the prior art, such as rolling, dicing saw cutting, electrodischarge machining, etc. are difficult to enact properly, can provide unsatisfactory results and are expensive to perform."

It is known that the mechanical response of metals and alloys changes substantially as the characteristic length scale of a process decreases below one millimeter. There is a significant "size effect." Mechanical properties that are relevant to metal forming, including material hardness and brittleness, depend on the length scale of the deformation. Conventional metal-working techniques, used at length scales of a millimeter or larger, do not necessarily work (or do not necessarily work in the same way) at dimensions on the order of 200 µm, 100 µm, 50 µm, 10 µm, 5 µm, 3 µm, 2 µm, 1 µm, or even smaller. A further complication is the fact that the mechanical response of a metal also depends substantially on the specific deformation geometry. As one example, (normalized) torsional strength increases as the diameter of a metallic wire diameter decreases, while (normalized) tensional strength of the same wire hardly changes as a function of the wire's diameter. As yet another complication, the mechanical responses of a material depend on the process temperature, in a manner that is not always straightforward. See, e.g., N. A. Fleck, G. M. Muller, M. F. Ashby, J. W. Hutchinson, Strain gradient plasticity: Theory and experiment, Acta Metallurgica et Materialia 42(2), 475-487 (1994)

In an indentation experiment, a sharp indenter is pressed into a flat metal piece, and the average contact pressure is measured when equilibrium is reached. This contact pressure is defined as the metal's hardness. The process of indentation leaves an imprint, a permanent mark, on the surface of the indented metal. See, e.g., D. Tabor, The Hardness of Metals, Clarendon Press, Oxford, UK (1951). Metals typically exhibit an indentation size effect. The hardness of an indented metal increases as the size of the imprint decreases. For example, FIG. 2 depicts the indentation size effect for an aluminum single crystal indented by a three-sided, pyramidal indenter with a large included angle at the tip (i.e., a blunt tip). Starting at the "bulk" value (i.e., that when the imprint size becomes very large), the measured hardness increased substantially as the imprint diameter decreased below 20 micrometers, especially below 10 micrometers, and even more so below 5 micrometers. FIG. 2(b) from priority application 61/296,204 (not included here) shows a scanning electron microscopy image of the pyramidal indenter. The mechanical response of the aluminum, when deformed by a blunt tip, did not deviate significantly from that at the macroscale when the indent diameter was ~20 micrometers or greater. But the response departed substantially from that of the bulk scale as the length scale decreased below about 20 micrometers, especially below 10 micrometers, and even more so below 5 micrometers.

SUMMARY OF THE INVENTION

We have discovered a novel method for producing metal-based, high-aspect-ratio microscale structures (HARMs) such as microchannels. The preferred manufacturing method operates in a continuous mode, and employs low-temperature rolling of metals, for example copper, copper-based alloys, aluminum, aluminum-based alloys, and other metals. Low-temperature rolling uses rollers with high yield strengths. We have also developed a process to fabricate high-strength metal rollers with microscale details. We have also developed improved methods for bonding metal microchannel sheets or plates to flat metal sheets or plates to form single-, double-, and multiple-layered microchannel structures.

The novel process can operate at much lower temperatures than prior methods of compression microscale molding of metals. A typical temperature for prior microscale compression molding techniques would be around 450° C. Surprisingly, the novel microscale rolling process can operate successfully at far lower temperatures, even as low as room temperature or lower. The preferred method for creating metallic HARMs is rolling of metal sheets/plates at low temperatures ("low," as compared to the particular metal's melting point). The preferred method for creating complete metallic microchannel devices is to induce continuous, intermediate-layer bonding by rolling. The present invention allows the formation of metal-based HARMs at much lower temperatures than any prior work would have suggested is possible—even at room temperature or lower.

Surprisingly, the novel process works successfully at temperatures below about 40% of $T_m$ (the melting temperature of the metal or alloy), for example from about 0.2 to about 0.4 of $T_m$, more preferably from about 0.25 to about 0.35 of $T_m$. For example, for Al, 0.2 $T_m$ is about −90° C., and 0.4 $T_m$ is about 100° C., so the process may be used in aluminum from about −90° C. to about 100° C., much cooler temperatures than would previously have been thought feasible. Likewise, for Cu 0.2 $T_m$ is about −2° C., and 0.4 $T_m$ is about 270° C., so the process may be used in copper from about 2° C. to about 270° C., again much cooler than would have been expected. Note that for both Cu and Al, these regimes encompass room temperature processes, making the novel process far easier to implement than prior processes that have required substantial heating (e.g., to 450° C.).

We have discovered that at small scales the results of indentation experiments depend not just on the dimensions, but also on the geometry of the indenter. To our knowledge, indenter experiments employing geometries that are directly relevant to the formation of high aspect ratio microchannels have not previously been reported. The consequences of our observations are quite surprising: microscale rolling of metals and alloys may be carried out at temperatures far lower than would have previously been thought feasible. When a metal is indented by a blunt indenter, as illustrated in FIG. 2, the resulting plastic flow is substantially less than what occurs during the formation of high-aspect-ratio channels, with their very different geometries. To better assess the formation of high-aspect-ratio microchannels in metals by rolling, we conducted mechanical experiments to measure plastic flow in metals using custom indenter geometries that are more nearly similar to geometries that would be encountered in forming typical HARMs. Surprisingly, we found that the plastic flow occurs more readily than would have been expected based on the results from the experiments using a blunt pyramidal indenter. We unexpectedly discovered that the materials can annihilate dislocations during large strain plastic deformation, in geometries relevant to roll forming, and at length scales from several hundred microns down to sub-micron regime.

We have performed a series of original experiments, in which a single, long, rectangular, diamond punch indenter was pressed in a normal direction into flat metal pieces to a significant penetration depth. The normal force on the indenter was measured and converted into a normal contact pressure as a function of the indentation depth. The large indentation depths observed in these experiments showed that the indented material underwent a significant plastic flow, of a magnitude suitable for forming metallic microchannels or other HARMs. The results from our novel experiments gave a better indication of the feasibility of using a rolling technique to form microscale metallic HARMs, including microchannels. Unexpectedly, we found that there is a substantial size effect for this indenter geometry. The size effect manifests itself in surprising and unexpected ways, and differs considerably from what is seen with a pyramidal indenter. Surprisingly, the yield strength of the material appeared to increase significantly only when the punch width decreased below 3 μm. When the punch width was 3 μm or 5 μm, the measured molding response appeared to be essentially independent of the punch width; and unlike the case for the pyramidal indenter, that response was generally in agreement with macroscale measurements. In other words—for geometries relevant to rolling—the apparent hardening of the material occurred at smaller dimensions than would have been expected based upon more traditional indentation experiments conducted with a blunt pyramidal indenter [e.g., FIG. 2]. Even more surprising, when the metal was indented at low temperature by a long, rectangular punch, the metal appeared to be capable of accommodating much higher plastic strains than would have been expected. Without wishing to be bound by this hypothesis, we propose that the metal's capacity for large plastic strains at these geometries may result from annihilating dislocations at the boundaries of micro- or nano-scale grains. I.e., a large strain indentation leads to fractionalization of grain(s) at the micro- or nano-scale, and the micro- or nano-scale grains thus generated in turn accommodate the high number of dislocations that are needed for deformation at large strains and large strain gradients.

We have successfully formed metallic microchannel structures in aluminum and copper by rolling at room temperature. The ability to form metal microstructures at relatively low temperatures will help reduce costs and increase production throughput. Optionally, microscale metal rolling can be employed as a continuous process capable of creating metallic HARMs of essentially arbitrary length.

MODES FOR CARRYING OUT THE INVENTION

Mechanical Response During Micro- or Nano-Scale Molding of Metals.

Figure 3:
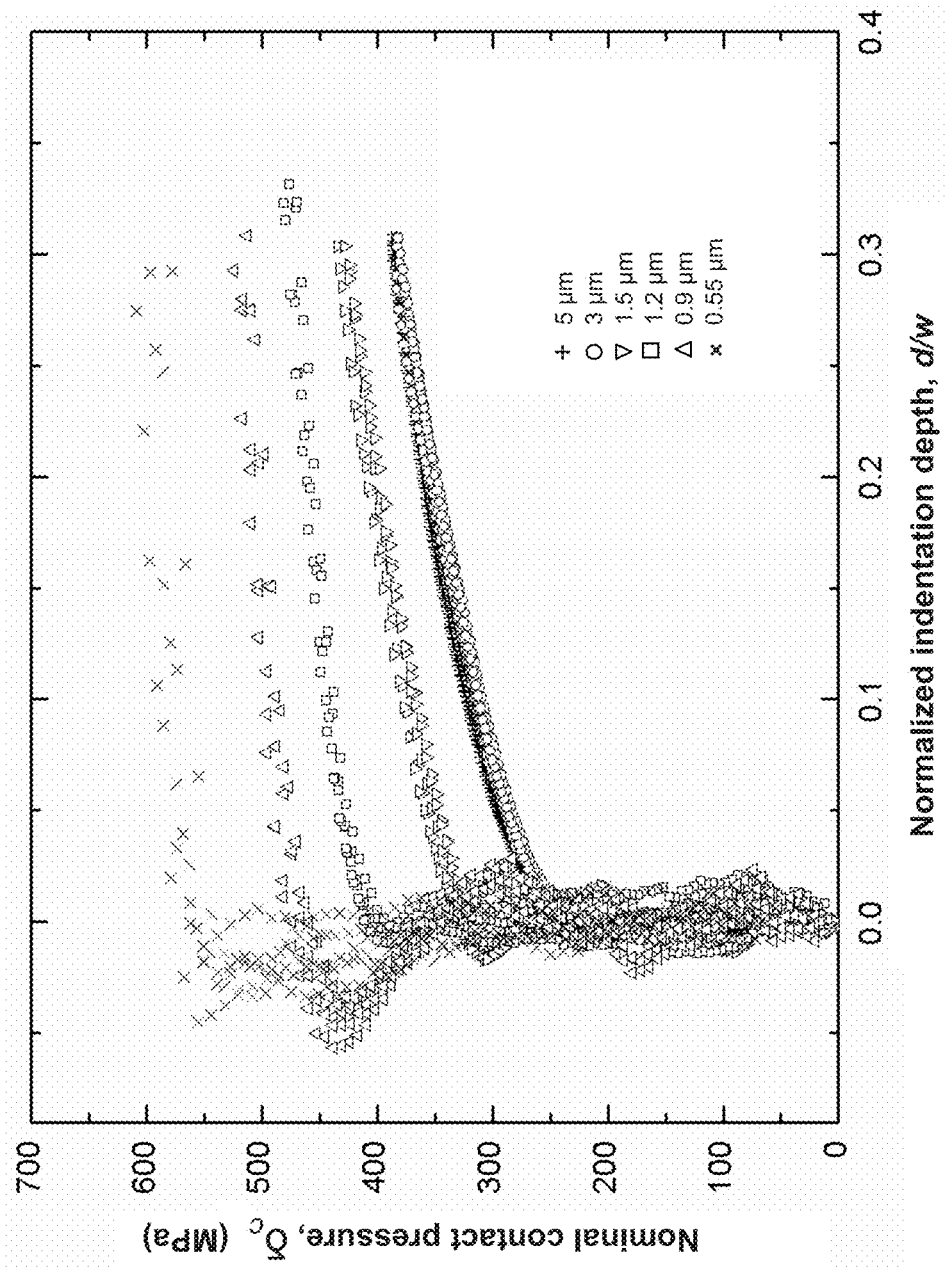
FIG. 3 depicts the measured molding response of single crystal Al at room temperature when molded with rectangular diamond punches of different widths. The normal contact pressure was plotted as a function of the normalized indentation depth (actual depth d divided by width).
Figure 4:
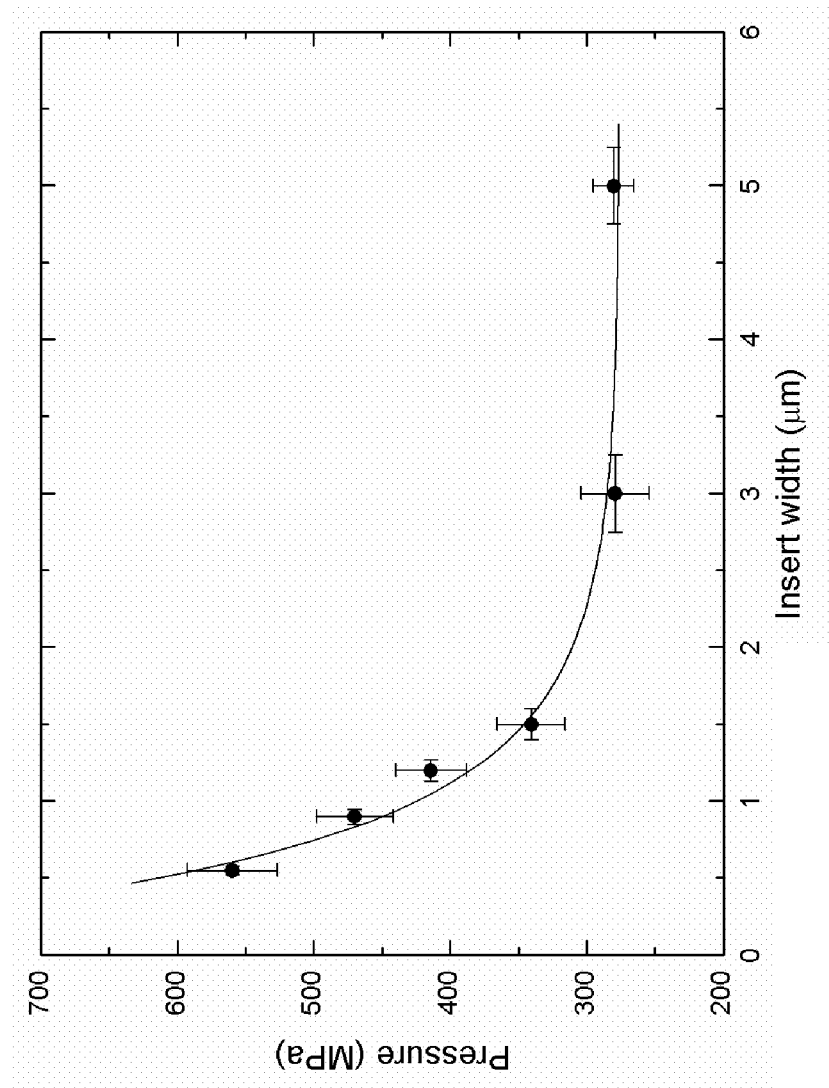
FIG. 4 depicts the contact pressure at the transition from stiff molding to compliant molding as a function of the width of the rectangular diamond punch.

Metal molding with characteristic length scales from microns to nanometers was studied by indentation experiments on a single Al crystal using a single, long, rectangular, diamond punch. The diamond punch was fabricated from a commercial, flat-ended, conical indenter by focused ion beam (FIB) cutting. After one molding experiment had concluded, the punch width was reduced by further FIB cutting for the next experiment, and so forth, resulting in a series of molding experiments in which the punch width decreased from ~5 μm to ~500 nm. FIG. 3 from priority application 61/296,204 (not included here) shows the first FIB cut of a flat-ended conical diamond indenter, resulting in a rectangular punch with length, width, and height of 32 μm×15 μm×15 μm. Subsequent FIB cutting reduced the punch width sequentially to ~5 μm, ~3 μm, ~1.5 μm, ~1.2 μm, ~900 nm, and ~550 nm. FIG. 4 from priority application 61/296,204 (not included here) shows the configuration of the rectangular punch at a width of ~900 nm. Smooth punch side walls were seen, with some minor defects. Instrumented molding of the single-crystal Al specimen with the series of rectangular diamond punches was carried out with a NanoInstrument Nanoindenter XP. All indentations were made on the same, single crystal Al specimen. The loading rate was the same for all runs. The molding response, i.e., the total axial load as a function of total axial displacement, was continuously recorded.

The measured total displacement included a "system stiffness" contribution arising from the diamond punch and the displacement transducer themselves. To obtain the true molding response, the system stiffness contribution was measured and subtracted. The stiffness of the Nanoindenter system was obtained by multiple measurements of the total force—total displacement curve on the same single crystal Al, with the diamond punch compressing the Al at a sufficiently small load so as not to penetrate the Al to a significant extent. These stiffness measurements were repeated for each punch width.

After correcting for the "system stiffness" contribution, the total compressive force on the insert was expressed as a function of the indentation depth of the punch into the molded Al. The total compressive force was normalized to a contact pressure by dividing by the nominal contact area; and the indentation depth was normalized to a dimensionless number by dividing the depth by the width of the rectangular punch.

FIG. 3 shows measured nominal contact pressures as a function of the normalized indentation depth at different punch widths, measured at room temperature. The data scatter, which was about ±10% at a given punch width, is typical of the variability seen in micromolding processes. (The nominally negative indentations seen in FIG. 3 were artifacts resulting from subtracting the system stiffness contribution, and reflect experimental uncertainties in making precise stiffness determinations.) The molding response curves were all qualitatively similar. At each punch width, the initial response was stiff, i.e., contact pressure increased rapidly with small increases in indentation depth. Thereafter the curves exhibited a sudden bend-over, after which the molding response became much more compliant, i.e., contact pressure increased approximately linearly with further increases in depth at a much less steep rate. The contact pressure at the transition from a stiff to a more compliant response correlated well with the yield strength of the indented material.

Figure 1A:
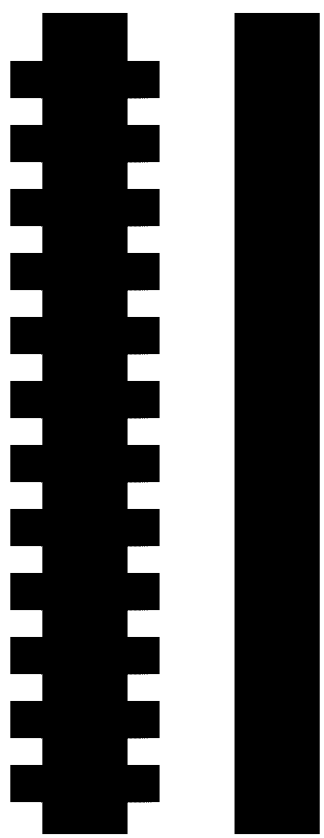
FIGS. 1A and 1B shows schematics of structured rollers capable of creating one-sided and two-sided microchannel structures, respectively, by rolling metal sheets or plates between them.
Figure 1B:
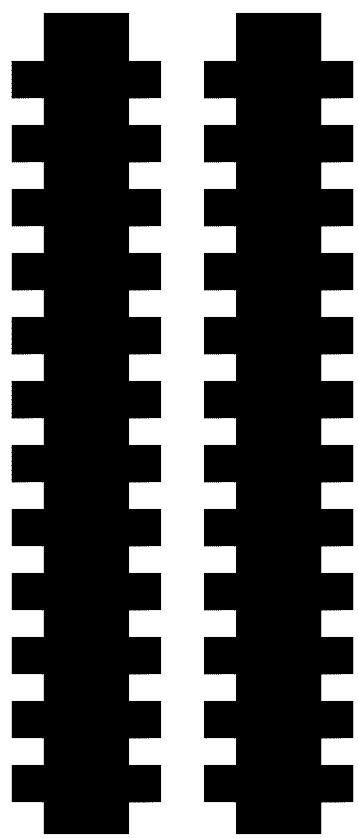
Figure 2:
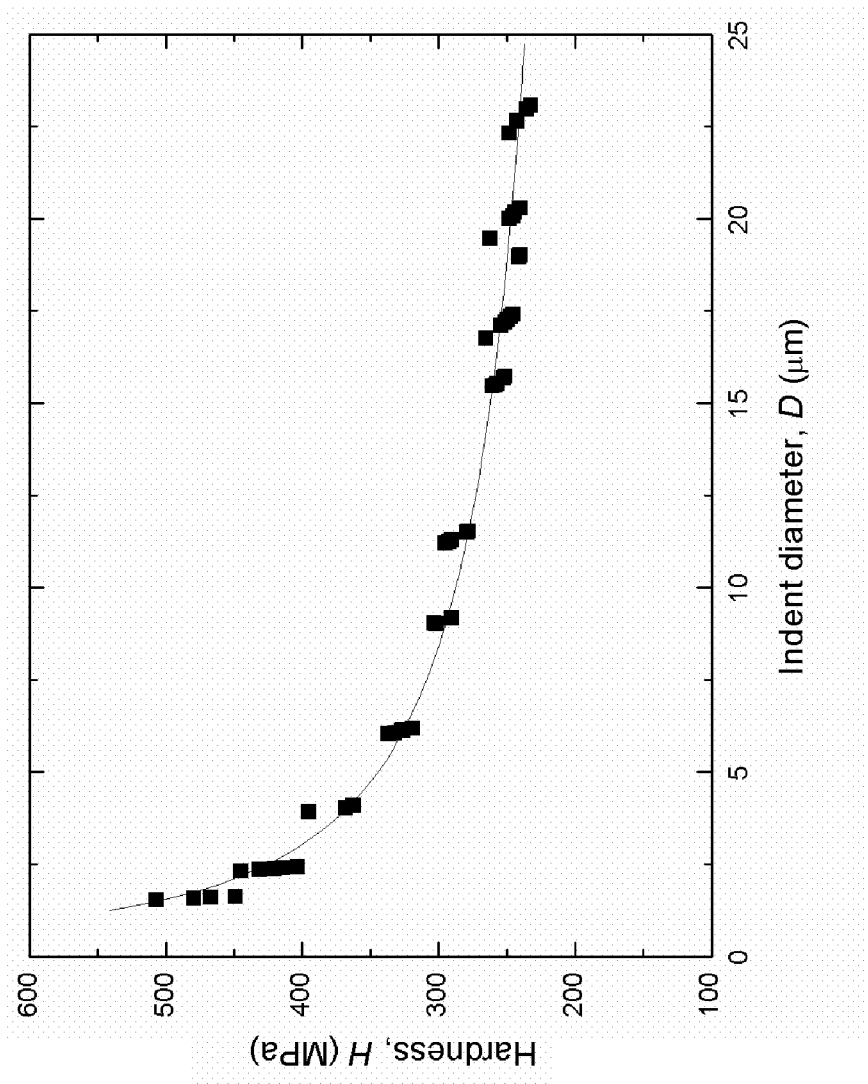
FIG. 2 shows the measured indentation size effect in a single aluminum crystal using a blunt pyramidal indenter, the contact pressure or hardness as a function of the diameter of the indenter.

The measured molding response curves were essentially the same for punch widths of 3 μm and 5 μm. However, as the punch width decreased to 1.5 μm and below, the entire molding response curve shifted to substantially higher pressures. As shown in FIG. 4, the contact pressure at the stiff-to-compliant transition began to increase at a punch width of 1.5 μm, and continued to increase monotonically as punch width decreased to 1.2 μm, 0.9 μm, and 0.55 μm. As compared to indentation with a blunt pyramidal indenter (see FIG. 2), the data in FIG. 4 clearly indicated that the apparent increase in material yield strength upon indentation with a long rectangular punch did not occur until much smaller dimensions were reached (below ~3 μm, compared to ~20 μm for the blunt pyramidal indenter). These experiments indicated that when the material was deformed by a long, rectangular punch, the mechanical response remained about the same as the macroscale behavior from dimensions above ~1 mm down to about ~3 μm. Recall that this series of experiments was performed at room temperature. These results suggest that forming HARMs by rolling will not encounter material hardening until very small dimensions (below ~3 μm) are reached.

In other words, prior results (e.g., those based on experiments with a pyramidal indenter) would have suggested to one of skill in the art that compression molding in metals would be unlikely to work well for high aspect ratio channels that are smaller than about 10 or 20 μm, because the metal would become too hard for convenient working. By contrast, we have unexpectedly discovered—using indenters whose geometry more closely matches what would be used for rolling HARMs microchannels—that the material does not begin to harden substantially until the width of the channel becomes about 3 μm or smaller. It is thus surprising that this technique may be successfully used to form high aspect ratio channels having a width in the regime above about 3 μm, particularly but not limited to the regime between about 3 μm and about 10 μm.

Figure 7:
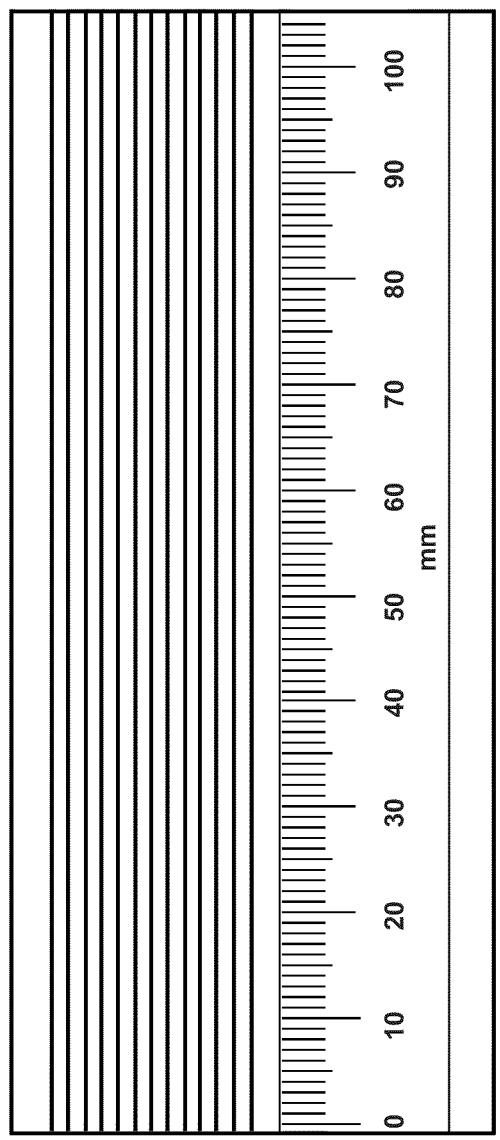
FIG. 7 is a drawing made from a photograph of a rolled, Al microchannel array made through the novel process.

Structural examinations of the Al single crystal specimen with the long, rectangular indentation showed additional unexpected results. Without wishing to be bound by this hypothesis, we propose that geometrically necessary dislocations form underneath the indenter, in regions of large plastic strain gradients. Large plastic strain gradients are generated when materials are deformed by indenters with sharp edges, such as the long rectangular punch. The generation of such geometrically necessary dislocations due to deformation causes material hardening, and material hardening increases with increased dislocation density. Further dislocation in the indented material causes not only hardening but also embrittlement, which may eventually result in cracked features. FIG. 7 from priority application 61/296,204 (not included here) shows a transmission electron microscopy (TEM) image of a cross-section of the single crystal Al specimen. The cross-sectioned TEM specimen was made by FIB cutting across a rectangular microchannel in the Al specimen after the specimen had been indented by a long rectangular punch 1.2 μm wide. To protect the microchannel and the material underneath from damage by the ion beam, the microchannel was completely filled by vapor phase-deposited Pt prior to FIB cutting. FIG. 7 from priority application 61/296,204 shows that the microchannel had smooth walls, corners, and bottom, without any cracking or damage. Surprisingly, there appeared to be no high dislocation density in the material underneath the microchannel. Instead, a number of small, sub-micron grains, indicated by arrows, formed underneath the indenter. Because the starting specimen was a single crystal, we surmised that these nano-grains formed during the indentation process. Since grain boundaries are known to be able to eliminate dislocations by absorption into the boundary, the nano-grain formation appears to have prevented the accumulation of a high density of dislocations within the indented material. This in turn preserved the material's ductility and allowed further plastic deformation to occur. Similar results were also seen at other punch widths. Our observations indicated that the process of nano-grain formation due to large strain plastic deformation remained operative even when size-related material strengthening occurred. These results were new and unexpected.

In summary, our experimental observations showed that metal is substantially more capable of plastic flow than would have been expected, in regimes relevant to the rolling of high aspect ratio microstructures, at lower temperatures, at smaller dimensions, and without hardening or embrittlement.

In a preferred embodiment, rollers with microscale structures are fabricated from a hard material, such as one of the tool steels or other refractory metals or alloys known in the art. The roller may be fabricated, for example, by micro mechanical milling or by micro electrical discharge machining (μEDM), to create microscale recesses upon the roller surface. Because roll-forming involves high-strain plastic deformation of the rolled metal or alloy, fresh metal-to-metal contact may occur between the rollers and the rolled material during formation. This metal-to-metal contact may induce material adhesion, leading to material transfer and damage to or from the formed features, the rollers, or both. To inhibit adhesion-induced damage, it is preferred to apply a surface modification to the roller, for example: (1) continuous application of a liquid-based lubricant to the roller; (2) electrochemical polishing (ECP) and conformal deposition of a bond-inhibitor coating to modify the surface, for example as described in U.S. Pat. No. 7,114,361 and published international patent application WO 2009/126339; or (3) application of a bond-inhibitor coating that can simultaneously act as a nanoscopic machining tool. An example of the third option is illustrated in FIGS. 8A and 8B from priority application 61/296,204 (not included here). FIG. 8A from priority application 61/296,204 shows an SEM overview of a thin titanium diboride ($TiB_2$) coating applied to conformally cover a Ni-based super alloy mold insert. The novel $TiB_2$ coating was deposited by inductively coupled, plasma-assisted magnetron sputtering under a radio-frequency (rf) inductively coupled plasma assist, with a total rf input power ranging from 600 to 1000 W. A specimen bias voltage of 50 to 100V was placed on the substrate during deposition. Three inch (7.6 cm) diameter, composite $TiB_2$ targets were coated by direct current balanced magnetron sputtering, with a cathode current from 0.3 to 1.0 A. The substrates were rotated within the deposition zone at about 10 rotations per minute. An elemental Cr intermediate layer was first deposited onto the substrates. The total coating thickness was about 100 to 500 nm. The plasma assist helped increase the conformality of the coating. A high magnification view of the $TiB_2$ on one microscale protrusion showed that the $TiB_2$ coating had a nanoscopically dense, yet bumpy morphology. The sharp facets of the nanoscale bumps likely act as nanoscopic machining tools during forming. The nanoscale bumps may lessen adhesive interactions between the roller and the rolled metal, and are expected to be either beneficial or neutral in the roll-forming process. Other coating materials that can exhibit nanoscopically bumpy morphologies under appropriate deposition conditions include metal nitride coatings such as titanium nitride (TiN), and metal carbide coatings such as titanium carbide (TiC). Preferred coatings for rollers with microscale protrusions may include metal borides, metal nitrides, or metal carbides. Following surface modification, the metal roller is used to make HARMs in softer metals, such as copper, aluminum, or their respective alloys, with little or no apparent damage to the rollers.

As used in the specification and claims, a "soft" metal should be understood to refer to a metal or an alloy that is sufficiently soft to hold an accurate impression of a pattern that is impressed by a hard roller during the process of this invention, without substantial pattern degradation such as cracking, and without causing substantial damage or degradation to the roller. Examples of "soft" metals include copper, aluminum, some copper alloys, and some aluminum alloys.

"Substantial damage or degradation" refers to a situation in which the particular combination of roller material, soft metal, pressure, temperature, and other process parameters are such that the roller is unable to produce at least five accurate impressions of a pattern in the soft metal, before the accuracy of the impressed patterns becomes unacceptable for purposes of the intended use of the resulting HARMs.

Figure 5A:
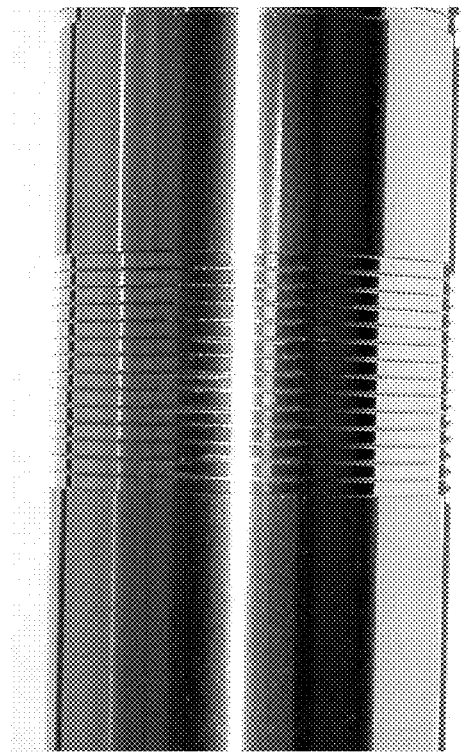
FIG. 5(A) depicts a scanning electron micrograph of a portion of a Ni-based refractory alloy roller with microscale protrusions.

Because the refractory metals and alloys used in the roller cannot be conveniently electrodeposited in an additive process, nor mechanically machined in a subtractive process, we have instead developed a μEDM/ECP process to fabricate rollers with intricate, microscale features. FIG. 5(A) shows a scanning electron micrograph of one portion of a roller made from a Ni-based, refractory, Inconel superalloy. The microscale protrusions on the roller were created by μEDM, and were about 300 μm wide.

Figure 5B:
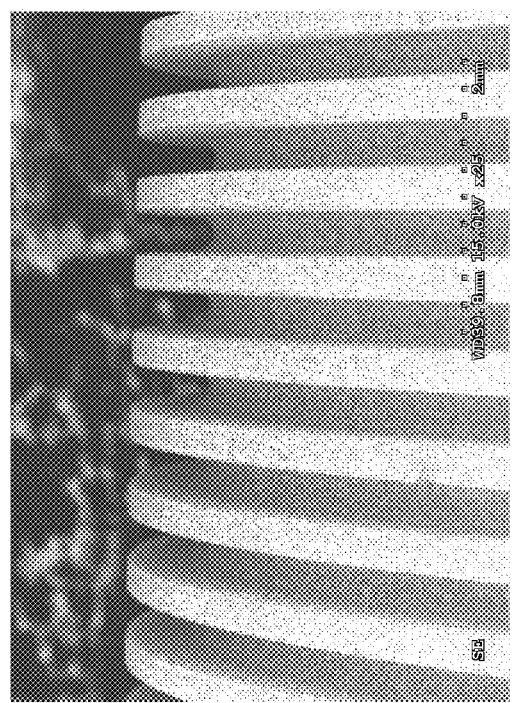
FIG. 5(B) depicts an optical image of a steel-based roller with microscale protrusions.

For some Fe-based tool steels, microscale mechanical machining can instead be used to fabricate rollers with microscale structures, e.g., rectangular or trapezoidal microprotrusions. FIG. 5(B) shows a roller made of 4000-series steel, mechanically-machined with a lathe, 42 mm in diameter and 84 mm long. The "active" width of the forming area was about 25 mm, containing 13 annular microprotrusions with rectangular cross sections, each 300 μm wide and 600 μm deep. The distance between the centers of adjacent protrusions was ~2 mm.

Figure 6:
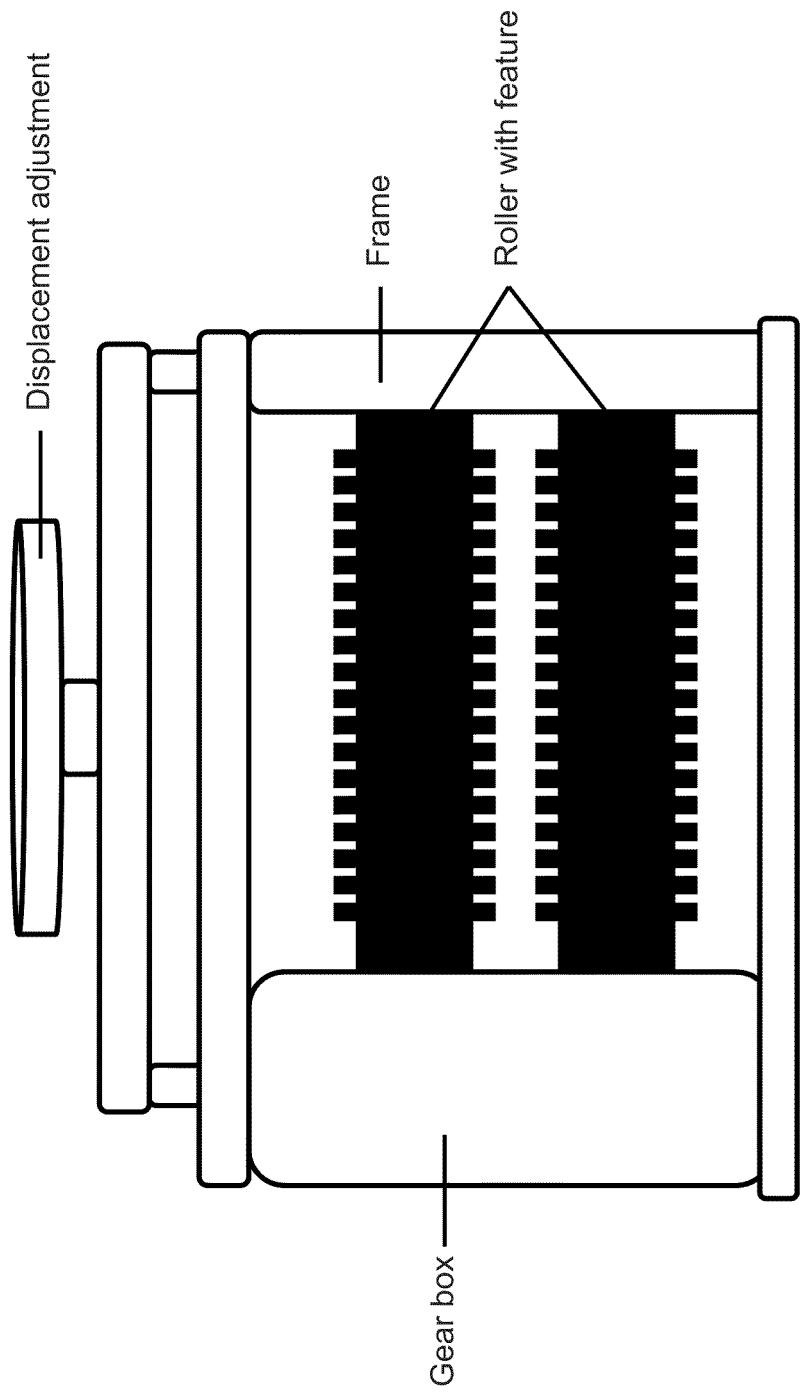
FIG. 6 depicts an assembled rolling tool.

Fabricated rollers with microstructures are assembled to form a rolling tool. FIG. 6 shows an overview of an experimental set-up. To form single-sided microscale structures on metal sheets or plates, one roller containing microscale structures and one smooth roller are used. To form double-sided microscale structures, two rollers are used, each containing microscale structures.

Figure 8:
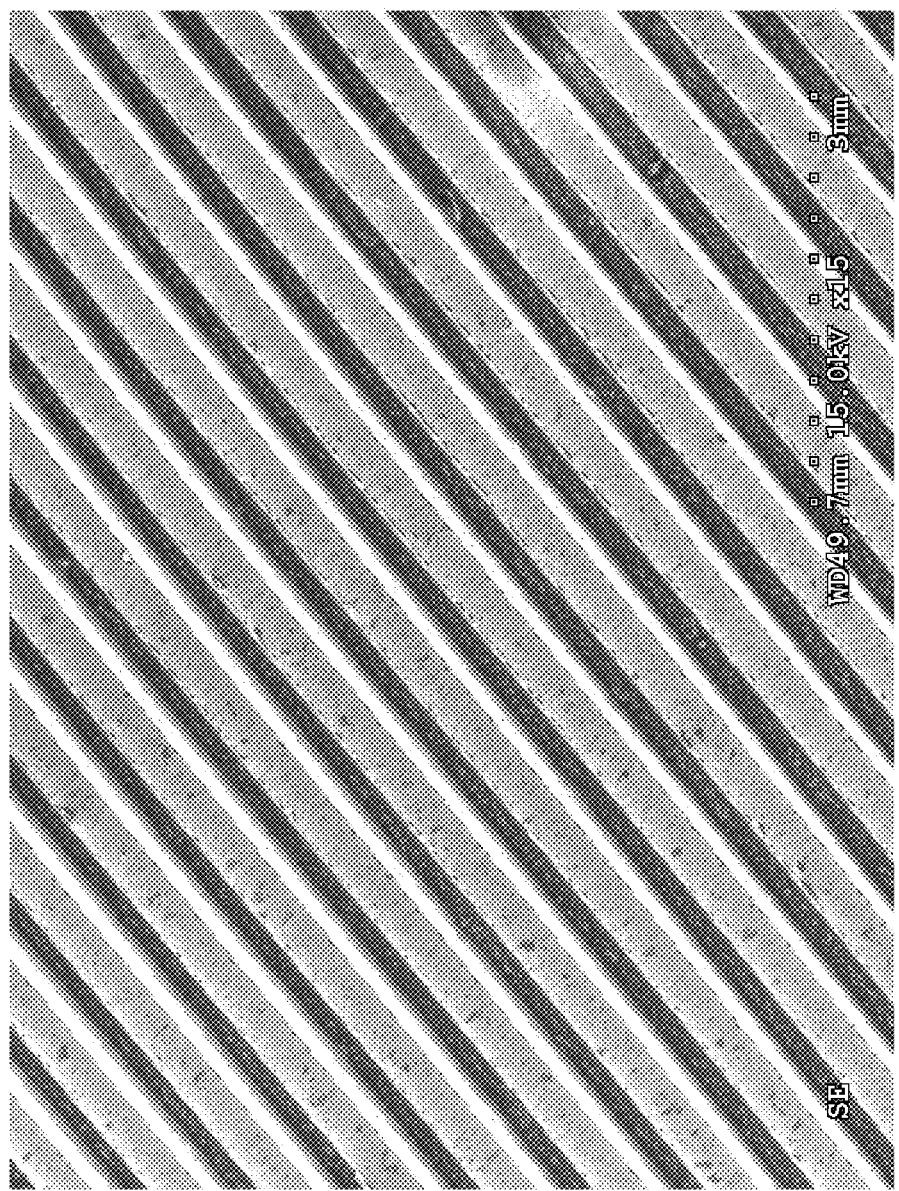
FIG. 8 depicts a scanning electron microscopy (SEM) image of a rolled Al microchannel array.
Figure 9:
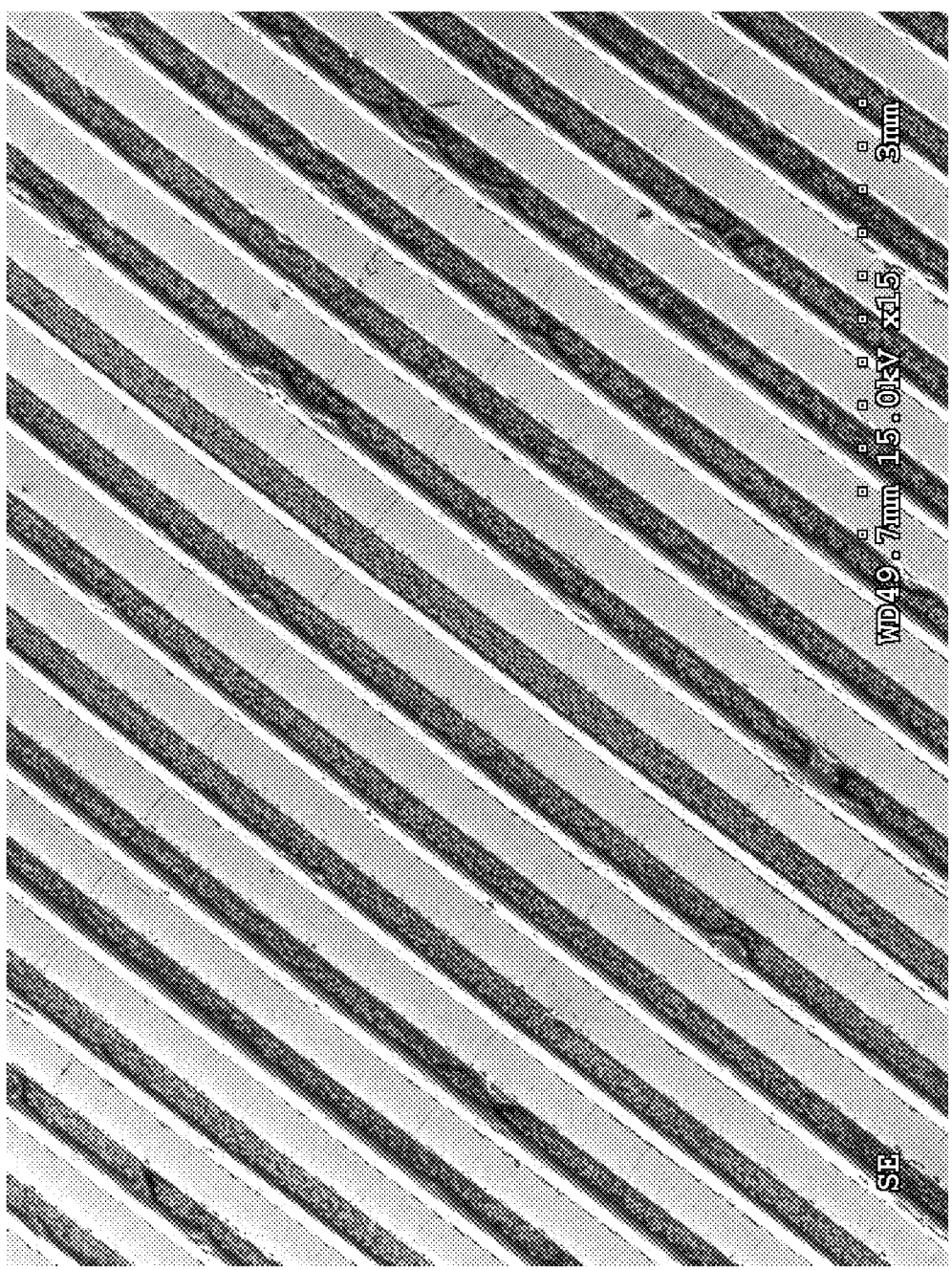
FIG. 9 depicts an SEM image of a rolled Cu microchannel array.

Cu 110 (99.9+wt. % Cu) and Al 6061 (1.0 wt. % Mg, 0.6 wt. % Si, 0.27 wt. % Cu, 0.2 wt. % Cr, balance Al) thin sheets, each ~1 mm thick, were rolled at room temperature with the rollers and set-up shown in FIGS. 5 and 6. The gap between the rollers was selected to achieve the desired microchannel depth, as described below. The thin metal sheets passed through the active area of the roller to form a long microchannel array. FIG. 7 is a drawing made from a photograph of an overview of long, rolled microchannel arrays formed in aluminum. FIGS. 8 and 9 show SEM images of rolled microchannel arrays in aluminum and copper, respectively. The rolled Cu and Al microchannels had vertical sidewalls and very sharp sidewall-to-bottom transitions. The top surfaces, sidewalls, and bottoms of the microchannel were all very clean. The measured depth of the microchannels was ~500 μm on the aluminum sheet and ~400 μm on the copper sheet. Such molded aluminum and copper sheets can serve as "building blocks" for aluminum- and copper-based microchannel devices after capping layers are bonded to them, for example using the eutectic brazing technique disclosed in published international patent application WO 2009/126339.

Figure 10:
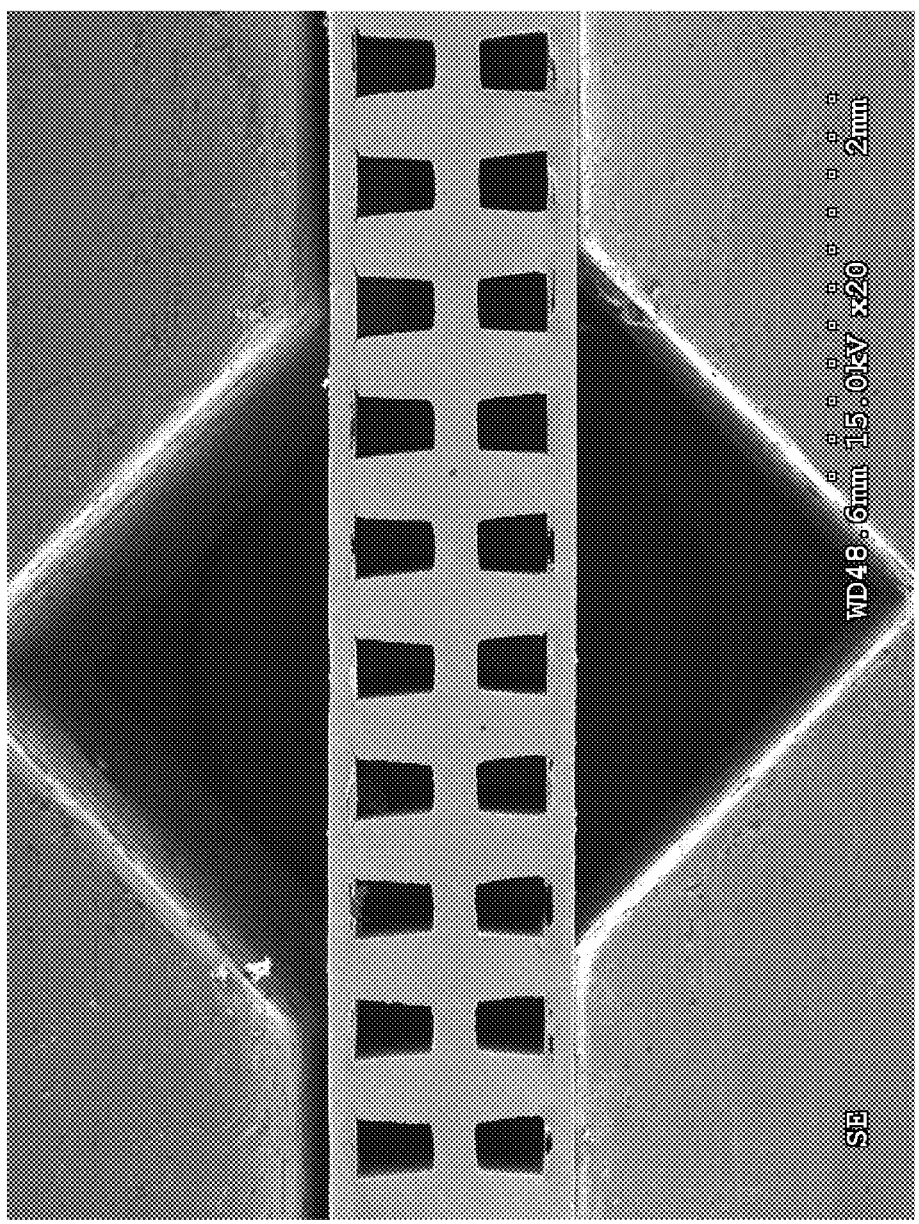
FIG. 10 depicts an SEM cross-sectional view of a portion of a bonded, layered, Cu microchannel structure. The middle Cu layer was rolled through two facing rollers, each roller having trapezoidal microprotrusions on its surface. The two-sided Cu microchannel structure was subsequently bonded to two thin Cu sheets (top and bottom) to form an enclosed, two-layered, Cu microchannel device.

Using one or more thin film or thin foil intermediate layers, rolled aluminum- and copper-based microchannel arrays have been successfully bonded. FIG. 10 shows an example of a double-sided, rolled, copper microchannel array bonded with two ~100 μm thick copper sheets using free standing aluminum thin-foil intermediate layers.

Bonding experiments were carried out using an MTS858 single-axis testing system interfaced to a high-vacuum chamber with two heating stations. The thickness of the rolled copper microchannel sheet was ~1000 μm. The bonding surfaces of the microchannel sheet and the flat thin copper sheets were etched in hydrochloric acid for a few seconds to remove surface oxides, and rinsed with deionized water. Three copper sheets were stacked on top of one another, with the molded microchannel sheet in the middle. A 10 μm aluminum freestanding thin foil was inserted into each of the two interfaces. The entire assembly was placed on top of the lower heating station. The chamber was evacuated, both heating stations were heated above 500° C., and the upper heating station was then put into contact with the assembly. An increasing compression force was applied to the assembly at a constant loading rate of 500 N/min. The force was held constant for 5 min once the compression force had reached an average applied pressure of about 3 MPa. The final bonding temperature for the sheet/microchannel/sheet assemblies was held at about 600° C. After the constant force hold, the linear actuator was withdrawn from the assembly and the system was cooled down. FIG. 10 shows a cross-sectional view of a double-layered copper microchannel formed with rollers having trapezoidal microprotrusions. The copper layers were bonded with free-standing aluminum thin film intermediate layers. The process successfully produced clean, enclosed microchannel structures without blockage.

Figure 11:
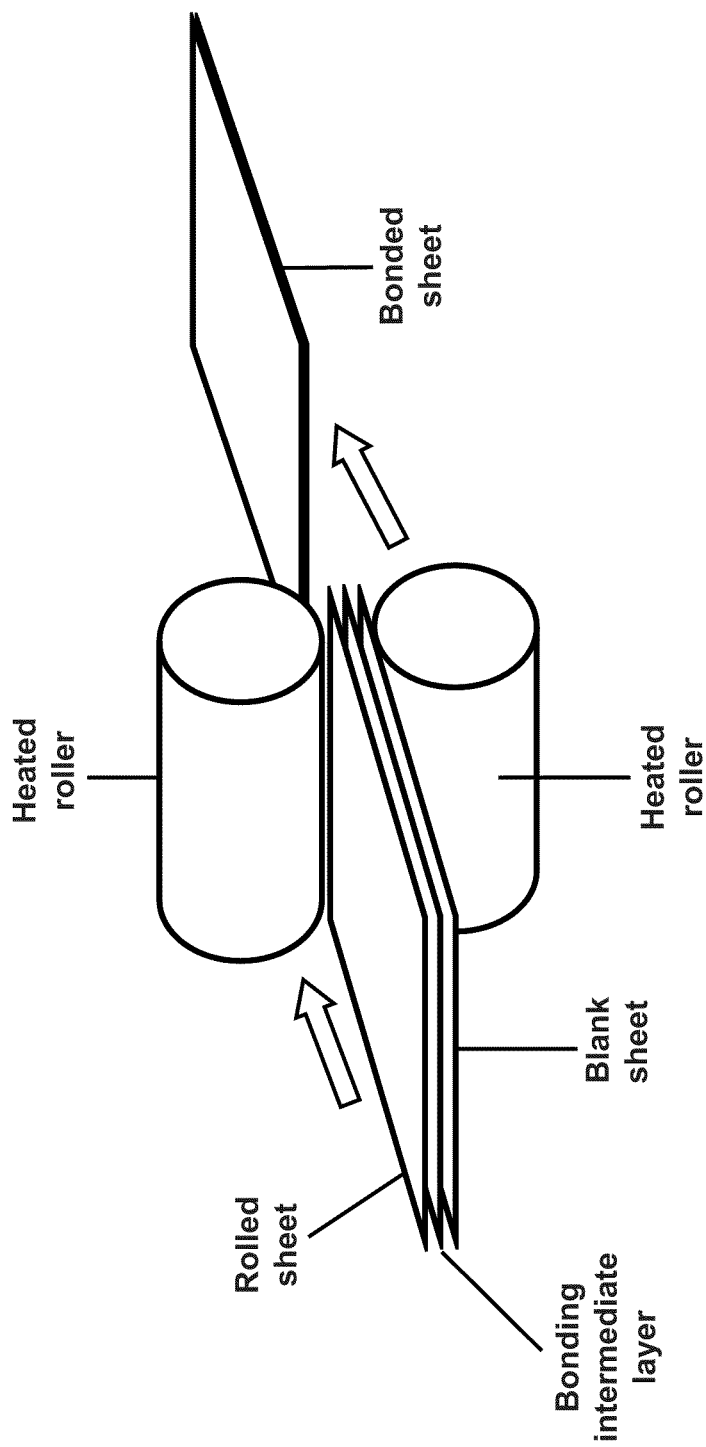
FIG. 11 depicts schematically a continuous roll-to-bond process for bonding roll-formed metallic structures into completely enclosed assemblies.

An alternative method for bonding rolled microstructures is a continuous roll-to-bond process, as illustrated schematically in FIG. 11. This embodiment includes two rollers with heaters. The rollers are heated to the desired temperature, e.g., 620° C. for Cu bonding. A blank Cu sheet and a rolled Cu sheet with microstructures, together with a suitable thin foil intermediate layer, are passed through the two heated rollers. The copper—intermediate layer—copper "sandwich" assembly is heated upon contact with the rollers, which simultaneously apply a compression force to the "sandwich." The local bonding temperature is controlled by the rotation speed of the rollers and the roller temperatures. Using this continuous bonding method, rolled microstructure assemblies can be bonded with essentially no limitation on length.

Figure 12:
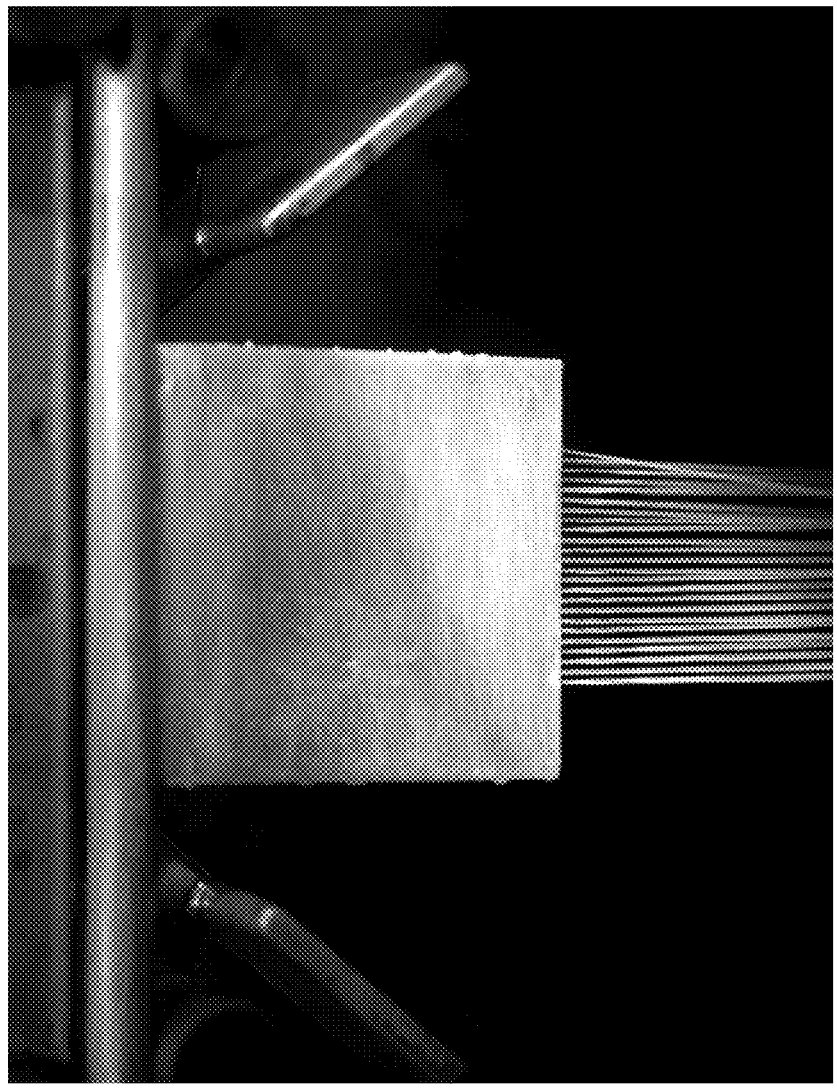
FIG. 12 depicts water jets exiting from an all-Cu-based, low-profile, metal-based microchannel heat exchanger (MHE).

A bonded prototype two-layer microchannel structure made by this process had a very low profile, with a total thickness of only ~1 mm. Such low profile microchannel structures can be very useful in functional devices, such as a copper-based, low-profile microchannel heat exchanger (MHE). FIG. 16 from priority application 61/296,204 (not included here) shows a photograph of a partially assembled, copper-based, low-profile MHE with one end attached to a liquid supply tube and the other end left open. FIG. 12 shows individual micro water jets exiting from the open end of the MHE, without leakage.

In addition to making continuous channels as demonstrated in these prototypes, the novel process may also be used to form multiple copies of discrete HARMs. The complement of a pattern is formed on the surface of one or both rollers, and a metal sheet is then fed through the rollers. Each time the roller completes one rotation, the pattern is impressed into the metal sheet.

The complete disclosures of all references cited throughout the specification are hereby incorporated by reference, as is the complete disclosure of the priority application, Ser. No. 61/296,204. In the event of an otherwise irreconcilable conflict, however, the present specification shall control.

REFERENCES

[1] E. W. Becker, W. Ehrfeld, D. Munchmeyer, H. Betz, A. Neuberger, S. Pongratz, W. Glashauser, H. J. Michel, and V. R. Siemens, Production of separation-nozzle systems for uranium enrichment by a combination of x-ray-lithography and galvanoplastics, Naturwissenschaften 69, 520 (1982).
[2] M. Heckele, W. Bacher, and K. D. Muller, Hot embossing—the molding technique for plastic microstructures, Microsystem Technologies 4, 122 (1998).
[3] V. Piotter, K. Mueller, K. Plewa, R. Ruprecht, and J. Hausselt, Performance and simulation of thermoplastic micro injection molding, Microsystem Technologies 8, 387 (2002).
[4] D. P. Adams, M. J. Vasile, G. Benavides, and A. N. Campbell, Micromilling of metal alloys with focused ion beam-fabricated tools, Precision Engineering 25, 107 (2001).
[5] G. L. Benavides, L. F. Bieg, M. P. Saavedra, and E. A. Bryce, High aspect ratio meso-scale parts enabled by wire micro-EDM, Microsystem Technologies 8, 395 (2002).
[6] R. Ruprecht, T. Gietzelt, K. Muller, V. Piotter, and J. Hausselt, Injection molding of microstructured components from plastics, metals and ceramics, Microsystem Technologies 8, 351 (2002).
[7] R. Ruprecht, T. Benzler, T. Hanemann, K. Muller, J. Konys, V. Piotter, G. Schanz, L. Schmidt, A. Thies, H. Wollmer, and J. Hausselt, Various replication techniques for manufacturing three-dimensional metal microstructures, Microsystem Technologies 4, 28 (1997).
[8] D. M. Cao, W. J. Meng, Microscale compression molding of Al with surface engineered LiGA inserts, Microsyst. Technol. 10, 662 (2004).
[9] D. M. Cao, J. Jiang, W. J. Meng, J. C. Jiang, W. Wang, Fabrication of high-aspect-ratio microscale Ta mold inserts with micro-electrical-discharge-machining, Microsystem Technologies 13, 503-510 (2007).
[10] J. Jiang, Fanghua Mei, W. J. Meng, E. Lara-Curzio, Microscale molding replication of Cu- and Ni-based structures, Microsyst. Technol. 14, 1731-1737 (2008).
[11] J. Jiang, Fanghua Mei, W. J. Meng, Fabrication of metal-based high-aspect-ratio microscale structures by compression molding, J. Vac. Sci. Technol. A26(4), 745 (2008).
[12] Fanghua Mei, P. R. Parida, J. Jiang, W. J. Meng, S. V. Ekkad, Fabrication, assembly, and testing of Cu- and Al-based microchannel heat exchangers, JMEMS 17(4), 869-881 (2008).
[13] M. P. Groover, Fundamentals of Modern Manufacturing: Materials, Processes, and Systems, Wiley, Hoboken, N.J. (2007).
[14] L. J. Guo, X. Cheng, Method of forming nanofluidic channels, U.S. Pat. No. 7,169,251 B2, issued Jan. 30, 2007.
[15] J. E. Leland, R. Ponnappan, Method of making micro channel heat pipe having corrugated fin elements, U.S. Pat. No. 6,216,343, issued Apr. 17, 2001.
[16] N. A. Fleck, G. M. Muller, M. F. Ashby, J. W. Hutchinson, Strain gradient plasticity: Theory and experiment, Acta Metallurgica et Materialia 42(2), 475-487 (1994).
[17] D. Tabor, The Hardness of Metals, Clarendon Press, Oxford, UK (1951).
[18] Ke Chen, Fanghua Mei, W. J. Meng, From micro to nano scale molding of metals: size effect in Al molding, abstract submitted to Fifth International Conference on Micromanufacturing, to be held Apr. 5-8, 2010 (unpublished as of the priority provisional filing date).
[19] Ke Chen, W. J. Meng, Fanghua Mei, J. Hiller, D. J. Miller, "From micro to nano scale molding of metals: size effect during molding of single crystal Al with rectangular strip punches", Acta Mater. 59, 1112-1120 (2011) (published after the priority provisional filing date)
[20] J. Jiang, G. B. Sinclair, W. J. Meng, Quasi-static normal indentation of an elasto-plastic substrate by a periodic array of elastic strip punches, Int. J. Solids Structures 46, 3677-3693 (2009).
[21] X. Feng, Y. Huang, K.-C. Hwang, Size effects in nanoindentation, in Micro and Nano Mechanical Testing of Materials and Devices (Springer, New York, 2008).

What is claimed:
1. A method for producing microscale metal or metal alloy structures, said method comprising the steps of:
  (a) providing a roller having surface features whose sizes and shapes are complementary to the sizes and shapes of the desired microscale structures, wherein the roller comprises a refractory metal or refractory metal alloy; and wherein a bond inhibitor layer adheres to the refractory metal or refractory metal alloy; wherein the bond inhibitor layer is selected from the group consisting of metal carbides, metal borides, and metal nitrides;
  (b) simultaneously rolling and pressing a metal plate or metal alloy plate with the roller to impress microscale structures into the plate; wherein at least one of the microscale structures has at least one dimension between about 1 micron and about 10 microns; wherein the plate comprises copper, aluminum, a copper alloy, or an aluminum alloy; and wherein said simultaneous rolling and pressing step occurs at a temperature below 40% of the melting point of the plate; and
  (c) continuing step (b) for a plurality of rotations of the roller on the same plate, either to produce a plurality of substantially identical high aspect ratio microscale metal or metal alloy structures on the plate, or to produce one or more continuous microscale structures on the plate having at least one dimension that is longer than the circumference of the roller, or both.
2. A method as in claim 1, wherein the roller comprises a tool steel.
3. A method as in claim 1, wherein the bond-inhibitor layer comprises titanium diboride.

4. A method as recited in claim 1, wherein the metal plate comprises aluminum, and wherein said rolling and pressing step occurs at a temperature between about −90° C. and about 100° C.

5. A method as recited in claim 1, wherein the metal plate comprises an aluminum alloy, and wherein said rolling and pressing step occurs at a temperature between about −90° C. and about 100° C.

6. A method as recited in claim 1, wherein the metal plate comprises copper, and wherein said rolling and pressing step occurs at a temperature between about 2° C. and about 270° C.

7. A method as recited in claim 1, wherein the metal plate comprises a copper alloy, and wherein said rolling and pressing step occurs at a temperature between about 2° C. and about 270° C.

8. A method as recited in claim 1, wherein said rolling and pressing step occurs at room temperature.

9. A method as recited in claim 1, wherein at least one of the microscale structures has at least one dimension between about 1 micron and about 5 microns.

10. A method as recited in claim 1, wherein at least one of the microscale structures has at least one dimension between about 1 micron and about 3 microns.

11. A method as recited in claim 1, wherein at least some of the microscale structures have at least one dimension between about 1 micron and about 2 microns.

12. A method for producing microscale metal or metal alloy structures, said method comprising the steps of:
  (a) providing a roller having surface features whose sizes and shapes are complementary to the sizes and shapes of the desired microscale structures, wherein the roller comprises a refractory metal or refractory metal alloy; and wherein a bond inhibitor layer adheres to the refractory metal or refractory metal alloy; wherein the bond inhibitor layer is selected from the group consisting of metal carbides, metal borides, and metal nitrides;
  (b) simultaneously rolling and pressing a metal plate or metal alloy plate with the roller to impress microscale structures into the plate; wherein at least one of the microscale structures has at least one dimension between about 1 micron and about 20 microns; wherein the plate comprises copper, aluminum, a copper alloy, or an aluminum alloy; and wherein said simultaneous rolling and pressing step occurs at a temperature below 40% of the melting point of the plate; and
  (c) continuing step (b) for a plurality of rotations of the roller on the same plate, either to produce a plurality of substantially identical high aspect ratio microscale metal or metal alloy structures on the plate, or to produce one or more continuous microscale structures on the plate having at least one dimension that is longer than the circumference of the roller, or both.

13. A method as in claim 12, wherein the roller comprises a tool steel.

14. A method as in claim 12, wherein the bond-inhibitor layer comprises titanium diboride.

15. A method as recited in claim 12, wherein the metal plate comprises aluminum, and wherein said rolling and pressing step occurs at a temperature between about −90° C. and about 100° C.

16. A method as recited in claim 12, wherein the metal plate comprises an aluminum alloy, and wherein said rolling and pressing step occurs at a temperature between about −90° C. and about 100° C.

17. A method as recited in claim 12, wherein the metal plate comprises copper, and wherein said rolling and pressing step occurs at a temperature between about 2° C. and about 270° C.

18. A method as recited in claim 12, wherein the metal plate comprises a copper alloy, and wherein said rolling and pressing step occurs at a temperature between about 2° C. and about 270° C.

19. A method as recited in claim 12, wherein said rolling and pressing step occurs at room temperature.

\* \* \* \* \*